(12) United States Patent
Lee et al.

(10) Patent No.: US 11,940,501 B2
(45) Date of Patent: Mar. 26, 2024

(54) METHOD AND APPARATUS FOR DIAGNOSING LOW VOLTAGE OF SECONDARY BATTERY CELL

(71) Applicant: LG CHEM, LTD., Seoul (KR)

(72) Inventors: Yong Tae Lee, Daejeon (KR); Myung Hoon Ko, Daejeon (KR); Jee Ho Kim, Daejeon (KR); Gyung Soo Kang, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 421 days.

(21) Appl. No.: 17/281,361

(22) PCT Filed: Oct. 4, 2019

(86) PCT No.: PCT/KR2019/013027
§ 371 (c)(1),
(2) Date: Mar. 30, 2021

(87) PCT Pub. No.: WO2020/071848
PCT Pub. Date: Apr. 9, 2020

(65) Prior Publication Data
US 2022/0043068 A1    Feb. 10, 2022

(30) Foreign Application Priority Data
Oct. 5, 2018  (KR) .......................... 10-2018-0118866

(51) Int. Cl.
*G01R 31/3842*  (2019.01)
*G01R 31/385*   (2019.01)
(Continued)

(52) U.S. Cl.
CPC ..... *G01R 31/3842* (2019.01); *G01R 31/3865* (2019.01); *H01M 10/44* (2013.01); *H01M 10/48* (2013.01); *H02J 7/0047* (2013.01)

(58) Field of Classification Search
CPC .......... G01R 31/3842; G01R 31/3865; H01M 10/44; H01M 10/48; H02J 7/0047
(Continued)

(56) References Cited

U.S. PATENT DOCUMENTS

2003/0180626 A1*  9/2003  Shima ............... H01M 10/0567
                                                    429/231.95
2016/0077159 A1*  3/2016  Petrucelli .............. G01R 31/382
                                                    324/426
(Continued)

FOREIGN PATENT DOCUMENTS

CN         1876256 A      12/2006
CN       203951163 U      11/2014
(Continued)

OTHER PUBLICATIONS

Extended European Search Report dated Nov. 10, 2021 issued in corresponding European patent application No. 19869594.2.
(Continued)

*Primary Examiner* — Nathaniel R Pelton
(74) *Attorney, Agent, or Firm* — Morgan, Lewis & Bockius LLP

(57) ABSTRACT

The present invention relates to a method and an apparatus for diagnosing low voltage of a secondary battery cell. The method for diagnosing low voltage of a secondary battery cell according to an embodiment of the present invention includes pre-aging a battery cell, charging the battery cell according to a preset charging condition, measuring a parameter for determining low voltage failure of the battery cell, comparing the measured parameter with a reference parameter, and performing formation when the battery cell is determined to be normal.

18 Claims, 10 Drawing Sheets

(a)

(b)

(51) Int. Cl.
*H01M 10/44* (2006.01)
*H01M 10/48* (2006.01)
*H02J 7/00* (2006.01)

(58) Field of Classification Search
USPC .......................................................... 324/432
See application file for complete search history.

(56) References Cited

U.S. PATENT DOCUMENTS

| | | | |
|---|---|---|---|
| 2016/0252586 A1* | 9/2016 | Shimura .............. | G01R 31/389 |
| | | | 702/63 |
| 2018/0323481 A1* | 11/2018 | Tsai ................. | G01R 19/16542 |
| 2020/0153255 A1* | 5/2020 | Inoue .................... | H02J 7/0013 |
| 2022/0099748 A1* | 3/2022 | Ye ....................... | H01M 10/446 |

FOREIGN PATENT DOCUMENTS

| | | |
|---|---|---|
| CN | 105929333 A | 9/2016 |
| JP | 2002-199608 A | 7/2002 |
| JP | 2007-304006 A | 11/2007 |
| JP | 10-1024318 B1 | 3/2011 |
| JP | 2014-002009 A | 1/2014 |
| JP | 5533785 B2 | 6/2014 |
| JP | 2014-222603 A | 11/2014 |
| JP | 2016-162559 A | 9/2016 |
| JP | 2017-139054 A | 8/2017 |
| KR | 10-1024318 B1 | 3/2011 |
| KR | 10-2016-0000141 A | 1/2016 |
| KR | 2016-0105349 A | 9/2016 |
| KR | 10-1769182 B1 | 8/2017 |
| KR | 10-2018-0013512 A | 2/2018 |
| KR | 2018-0071798 A | 6/2018 |
| KR | 10-2018-0081009 A | 7/2018 |
| TW | I621866 B | 4/2018 |
| WO | 2018-128395 A1 | 7/2018 |

OTHER PUBLICATIONS

International Search Report (with partial translation) and Written Opinion issued in corresponding International Patent Application No. PCT/KR2019/013027, dated Jan. 15, 2020.

Office Action issued in Chinese application 201980065435.5 dated Jun. 27, 2023.

\* cited by examiner (a)

(b)

METHOD AND APPARATUS FOR DIAGNOSING LOW VOLTAGE OF SECONDARY BATTERY CELL

CROSS-REFERENCE TO RELATED APPLICATIONS

This application claims the benefit of Korean Patent Application No. 10-2018-0118866, filed on Oct. 5, 2018, in the Korean Intellectual Property Office, the disclosure of which is incorporated herein in its entirety by reference.

TECHNICAL FIELD

The present invention relates to a method and an apparatus for diagnosing low voltage of a secondary battery cell.

BACKGROUND ART

Typically, in order to prevent the shipment of low voltage cells in the production of secondary batteries, low voltage failure was diagnosed by measuring a voltage drop according to change over time during a predetermined period (approximately 7 days to 50 days) after shipment charging, which is the last step of an activation process for the secondary batteries. Here, the low voltage failure refers to a phenomenon in which a battery exhibits a voltage drop behavior above a preset self-discharge rate.

In general, the shipment charging for secondary batteries is 20% to 50% of SOC (state of charge). In this case, a battery cell becomes in a state of being placed in a region in which a voltage change rate for the SOC is not large, so that even when micro-current leakage is generated inside the battery cell, it is difficult to identify the same.

As a result, there are problems in that a period of low voltage failure diagnosis (determining) is lengthened while diagnostic costs are increased, and also diagnosis accuracy is low.

DISCLOSURE OF THE INVENTION

Technical Problem

An aspect of the present invention provides a method and an apparatus for diagnosing low voltage of a secondary battery cell, which are capable of early diagnosis of low voltage failure of a battery cell by using properties of a region in which a voltage change rate to an SOC of the battery cell is large during a pre-aging process of an activation process for a secondary battery.

Technical Solution

According to an aspect of the present invention, there is provided a method and an apparatus for diagnosing low voltage of a secondary battery cell including pre-aging a battery cell, charging the battery cell according to a preset charging condition, measuring a parameter for determining low voltage failure of the battery cell, comparing the measured parameter with a reference parameter, and performing formation when the battery cell is determined to be normal.

As an example, the parameter may be a charging time from when the charging is started to when the battery cell reaches a preset voltage. Here, the charging time is either a charging time in a constant current mode or charging time in a constant current charging interval of a constant current-constant voltage mode.

Alternatively, the parameter may be a cumulative current amount accumulated from when the charging is started to when the battery cell reaches a preset voltage. Here, the cumulative current amount is a cumulative current amount in a constant current mode.

Alternatively, the parameter may be a cumulative current amount accumulated from when the charging is started to when the battery cell reaches a preset voltage and a preset current. Here, the cumulative current amount may be either a cumulative current amount in a constant current-constant voltage mode or a cumulative current amount in a constant current charging interval of the constant current-constant voltage mode.

Alternatively, the parameter may be an amount of voltage drop of the battery cell from when the battery cell has reached a preset voltage and self-discharge is then started to a preset time.

Here, the preset voltage is set to a voltage of which a voltage change rate with respect to an SOC is greater than or equal to a preset reference value.

Also, the reference parameter is set differently depending on the type of the battery cell.

Meanwhile, according to another aspect of the present invention, there is provided an apparatus for diagnosing low voltage of a secondary battery cell, the apparatus including a charging unit configured to charge a battery cell according to a preset charging condition after a pre-aging process and before performing a formation process, a measurement unit configured to measure a parameter for determining low voltage failure of the battery cell, and a control unit configured to compare the measured parameter with a reference parameter and determine the low voltage failure of the battery cell on the basis of a comparison result.

As an example, the measurement unit may measure, as the parameter, a charging time which is from when the charging is started to the battery cell reaches a preset voltage. Here, the charging time is either a charging time in a constant current mode or a charging time in a constant current charging interval of a constant current-constant voltage mode.

Alternatively, the measurement unit may measure, as the parameter, a cumulative current amount accumulated from when the charging is started to the battery cell reaches a preset. Here, the cumulative current amount is a cumulative current amount in a constant current mode.

Alternatively, the measurement unit may measure, as the parameter, a cumulative current amount accumulated from when the charging is started to the battery cell reaches a preset voltage. Here, the cumulative current amount may be either a cumulative current amount in a constant current-constant voltage mode or a cumulative current amount in a constant current charging interval of the constant current-constant voltage mode.

Alternatively, the measurement unit may measure, as the parameter, an amount of voltage drop of the battery cell from when the battery cell has reached a preset voltage and self-discharge is then started to a preset.

Here, the preset voltage is set to a voltage of which a voltage change rate with respect to an SOC is greater than or equal to a preset reference value.

Advantageous Effects

According to the present invention, low voltage failure of a battery cell may be diagnosed early by using properties of a region in which a voltage change rate to an SOC of the battery cell is large during a pre-aging process step of an activation process, so that diagnosis time, diagnosis costs, and diagnosis accuracy may be increased compared with the prior art.

Other effects of the present invention will be further described in accordance with the following examples.

BRIEF DESCRIPTION OF THE DRAWINGS

FIG. 1(a) shows an activation process of secondary battery manufacturing according to the prior art, and FIG. 1(b) shows an activation process of secondary battery manufacturing according to the present invention;

BEST MODE FOR CARRYING OUT THE INVENTION

Figure 1:
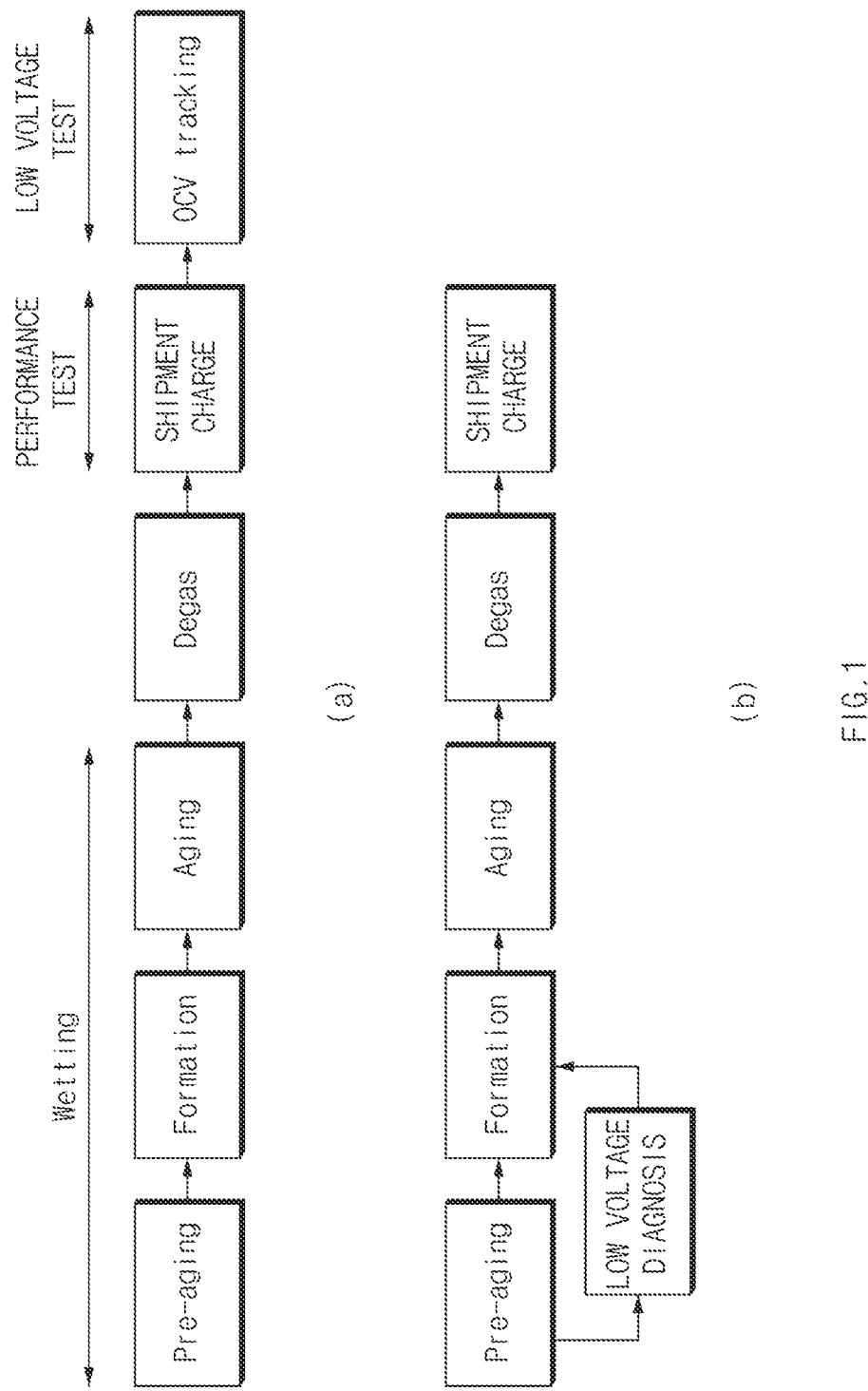
FIG. 1(a) and FIG. 1(b) are views showing an activation process of secondary battery manufacturing to describe low voltage inspection timing.

Hereinafter, some embodiments of the present invention will be described in detail with reference to the accompanying drawings. In adding reference numerals to components of each drawing, it should be noted that the same reference numerals are assigned to the same components as much as possible even though they are shown in different drawings. In addition, in describing embodiments of the present invention, when it is determined that the detailed description of the related well-known configuration or function interferes with the understanding of the embodiments of the present invention, the detailed description thereof will be omitted.

First, with reference to FIG. 1, an activation process of secondary battery manufacturing will be described.

FIG. 1 is a view showing an activation process of secondary battery manufacturing to describe low voltage inspection timing, FIG. 1(a) shows an activation process of secondary battery manufacturing according to the prior art, and FIG. 1(b) shows an activation process of secondary battery manufacturing according to the present invention.

As shown in FIG. 1, an activation process of secondary battery manufacturing may include a pre-aging process, a formation process, an aging process, a degassing process, and a shipment charging process.

In general, the pre-aging is a process for manufacturing a battery cell (that is, a bare cell) by receiving an electrode assembly in a battery container, injecting an electrolyte thereto, and sealing the battery container. The formation is a process for subjecting the pre-aged battery cell to initial charging under a predetermined voltage condition (for example, a voltage higher than SEI film formation of a negative electrode). The aging is a process for preserving the battery cell before the battery cell is stabilized in a constant state under a preset voltage condition (for example, 3.6-3.6 V) and a preset temperature condition (for example, 50° C.-70° C.). Here, the pre-aging process, the formation process, and the aging process correspond to a wetting period. The degassing is a process for removing unnecessary gas from the aged battery cell. As an example, if a secondary battery is circular or quadrangular, the degassing process may be omitted. The shipment charging is a process for charging the battery cell before shipment under a preset voltage condition (for example, 20-50% of SOC), and at the time of the shipping charging, a preset properties inspection test may be performed on the corresponding battery cell (for example, cell resistance, output, charge/discharge capacity, and the like).

Subsequently, as shown in FIG. 1(a), a low voltage test is typically performed through an open circuit voltage (OCV) tracking after the shipment charging process.

However, in the present invention, as shown in FIG. 1(b), a low voltage diagnosis is performed early between the pre-aging process and the formation process. However, the OCV tracking is omitted in FIG. 1(b), but may be additionally performed if necessary.

Figure 2:
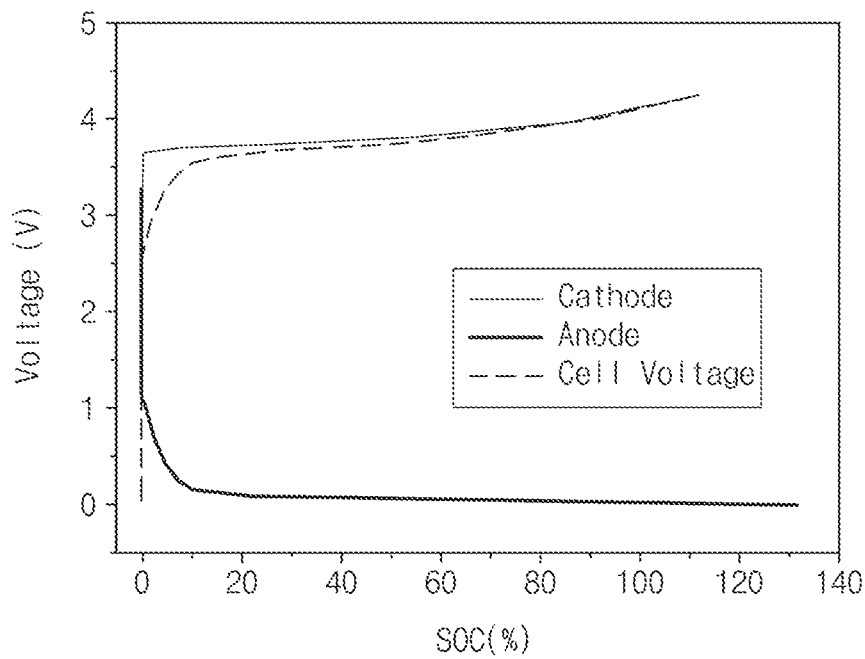
FIG. 2(a) is a graph showing the voltage properties of a secondary battery cell to an SOC.
FIG. 2(b) is an enlarged graph showing a section in which the SOC is 0-8% in the graph of FIG. 2(a)
Figure 2:
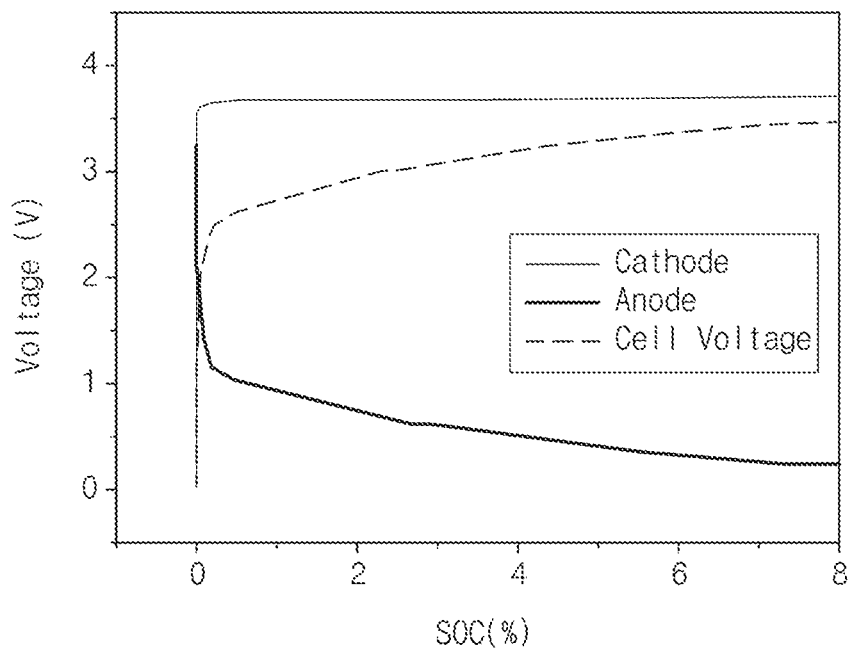

Next, with reference to FIG. 2(a) and FIG. 2(b), the reason why the low voltage diagnosis may be performed early between the pre-aging process and the formation process will be described. FIG. 2(a) is a graph showing the voltage properties of a secondary battery cell to an SOC, and FIG. 2(b) is an enlarged graph showing a section in which the SOC is 0-8% in the graph of FIG. 2(a).

In FIG. 2(a) and FIG. 2(b), changes in an anode, a cathode, and a cell voltage of a battery cell to an SOC of the battery cell during the charging of the battery cell in a pre-aging process of an activation process of a secondary battery are shown. Among the above, when looking at the change in cell voltage to the SOC, for example, as shown in FIG. 2(a), in a region in which the SOC is approximately 20-50%, the voltage is approximately 3.5-3.8 V, so that the voltage change rate is relatively small. However, as shown in FIG. 2(b), in a region in which the SOC is approximately 0.2% or less, the voltage is approximately 0-2.5 V, so that the voltage change rate is relatively large. That is, when the amount of charge is approximately 0.2% or less, the amount of change in cell voltage to the change in SOC is maximized.

Meanwhile, in the case of a low voltage failure cell, due to defects of a separator itself which insulates an anode or the cathode, or due to the weakening of insulation resistance caused by separator breakage by impacts or foreign materials insertion during assembly, leakage current is continuously generated, so that the amount of leakage current is greater than a normal cell. However, a low voltage failure cell only has more amount of leakage current than a normal cell and has a very small amount of absolute leakage current, so that it is difficult to sense the same. In particular, when the SOC is set to 20-50% during the shipment charging as in the prior art, even when micro-current leakage occurs inside the battery cell, the amount of leakage current is very small compared to the SOC, so that it is more difficult to determine the same. Here, as described above, the low voltage failure refers to a phenomenon in which a battery cell exhibits a voltage drop behavior above a preset self-discharge rate.

However, in the case of a low voltage failure cell having weakened insulation resistance, as shown in FIG. 2(b), even in a voltage range in which the change in cell voltage according to the change in the SOC is maximized (for example, approximately 2 V to 2.5 V), for example, it has been found that when charging is performed with a micro-current (suppressing an IR drop), electrons to be charged to a cathode flows back to an anode through an area in which insulation is weak, thereby increasing the amount of charge and the charging time. Also, when charging in a constant current-constant voltage mode, it has been found that the amount of cumulative charge current is increased when a voltage is maintained due to leakage current in the constant voltage mode. Also, it has been found that the amount of voltage drop is increased due to the leakage current during a constant rest period after constant current charging.

This is because the SOC has a very small value in a voltage range in which the change in cell voltage according to the change in the SOC is maximized (for example, approximately 2 V to 2.5 V) when charging is performed in the pre-aging process section, so that it is relatively easy to determine the change in the SOC caused by the change in the leakage current.

Accordingly, the present invention enables early diagnosis of low voltage failure of a battery cell by using properties of a region in which a voltage change rate of an SOC is large in a capacitor region between an anode and a cathode of the battery cell during a pre-aging process step of an activation process. In addition, the low voltage failure in the present invention may be understood as the insulation resistance failure of a battery cell.

Now, specifically, the apparatus and method for diagnosing low voltage of a secondary battery cell according to the present invention will be described.

First, with reference to FIG. 3, the apparatus for diagnosing low voltage of a secondary battery cell according to the present invention will be described.

Figure 3:
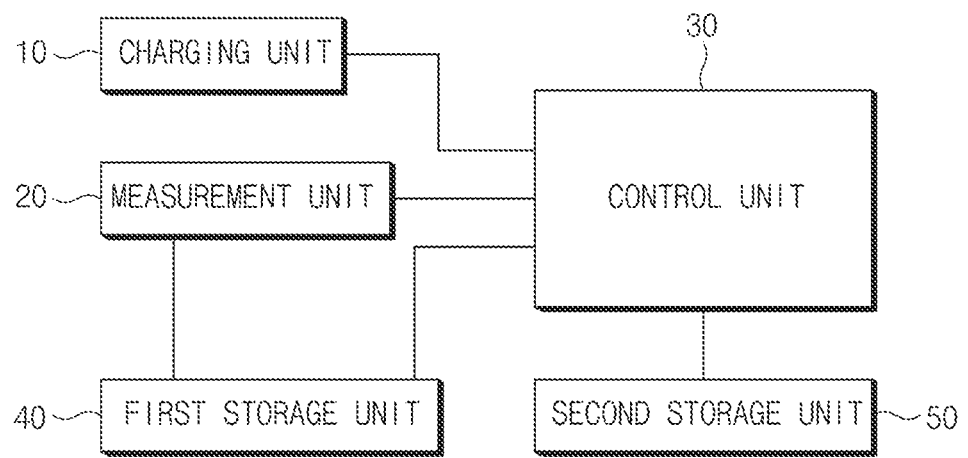
FIG. 3 is a block diagram showing the configuration of an apparatus for diagnosing low voltage of a secondary battery cell according to an embodiment of the present invention.

FIG. 3 is a block diagram showing the configuration of an apparatus for diagnosing low voltage of a secondary battery cell according to an embodiment of the present invention.

As shown in FIG. 3, the apparatus for diagnosing low voltage of a secondary battery cell according to the present invention includes a charging unit 10, a measurement unit 20, and a control unit 30.

The charging unit 10 is a component for charging a battery cell according to a preset charging condition after a pre-aging process. For example, as the pre-aging process, an electrode assembly is received in a battery container and an electrolyte is injected thereto, and the mixture is subjected to an electrode wetting period of a predetermined period of time. At this time, the wetting period may be set differently depending on the model of a battery. Next, a micro-current (for example, less than 1/100 C) is applied to an electrode cell subjected to the electrode wetting period to a preset target voltage (for example, 2 V). Here, the micro-current is a current which is constantly applied to the target voltage. In addition, the micro-current may refer to a current flowing when the target voltage is maintained in a constant voltage mode section. At this time, the charging unit 10 may charge the battery cell in a constant current mode or in a constant current-constant voltage mode. For example, the battery cell may be charged to a preset voltage with a constant current in the constant current mode, or may be charged to a preset voltage with a constant current in the constant current-constant voltage mode and then charged to a preset current with a constant voltage.

Next, the measurement unit 20 is a component which measures a parameter for determining low voltage failure of a battery cell. The measurement unit 20 may measure the parameter for determining low voltage failure during a charging period or a self-discharge period of the battery cell.

For example, the measurement unit 20 may measure, as the parameter for determining low voltage failure, a charging time which is from when the charging of the battery cell is started to the battery cell reaches a preset voltage. Here, the charging time is either a charging time in a constant current mode or charging time in a constant current charging interval of a constant current-constant voltage mode. As an example, when charged only in the constant current mode, the charging time until the preset voltage is reached may be measured. In addition, when charged in the constant current-constant voltage mode, charging time (or a charging current amount) until the preset voltage is reached in a constant current charging section may be measured.

Here, the preset voltage (for example, a target voltage) is set to a voltage of which a voltage change rate with respect to an SOC is greater than or equal to a preset reference value. For example, the preset voltage is set to 2.5 V or less.

Alternatively, the measurement unit 20 may measure a cumulative current amount as the parameter for determining low voltage failure.

As an example, the measurement unit 20 may measure, as the parameter for determining low voltage failure, a cumulative current amount accumulated from when the charging is started to the battery cell reaches a preset voltage. Here, the cumulative current amount is a cumulative current amount in a constant current mode. In other words, when charged only in the constant current mode, the measurement unit 20 measures a cumulative current amount until the preset voltage is reached.

Alternatively, the measurement unit 20 may measure, as the parameter for determining low voltage failure, a cumulative current amount accumulated from when the charging is started to the battery cell reaches a preset voltage and a preset current. Here, the cumulative current amount may be either a cumulative current amount in a constant current-constant voltage mode or a cumulative current amount in a constant current charging interval of the constant current-constant voltage mode. In other words, when charged in the constant current-constant voltage mode, the measurement unit 20 may measure a cumulative current amount in a constant current mode and a cumulative current amount in a constant voltage mode, respectively and measure the both as a combined cumulative current amount, or may measure only the cumulative current amount in the constant voltage mode. For example, the measurement of the cumulative current amount in the constant voltage mode, when charged to the target voltage by the constant current charging in the constant current mode and then switched to the constant voltage mode, is measuring a cumulative current amount accumulated from when the constant voltage charging is started to a charging current of the battery cell reaches a preset current.

As another example, the measurement unit 20 may measure, as the parameter for determining low voltage failure, an amount of voltage drop (that is, an amount of change in voltage) of a battery cell from when the battery cell has reached a preset voltage and self-discharge is then started to a preset time. For example, an amount of voltage drop during a self-discharge period (for example, a rest period) may be measured by self-discharging for a preset period of time after charging is performed to a voltage preset in a constant current mode. The self-discharge period, that is, the preset period of time may be set within 24 hours. Alternatively, the self-discharge period may be set to a period of time which is at least shorter than a period of time typically taken to measure an OCV at the time of shipment charging. Here, although the measurement of the amount of voltage drop is exemplified as charging in a constant current mode, charging in a constant current-constant voltage mode may be applied if necessary.

In addition, the measurement unit 20 may measure two or more parameters for determining low voltage failure and use the both for diagnosing low voltage failure. For example, when charged in a constant current-constant voltage mode, charging time until a preset voltage is reached in a constant current mode and a cumulative current amount in a constant voltage mode may be measured. Alternatively, when charged only in a constant current mode, charging time until a preset voltage is reached in the constant current mode and an amount of voltage drop during a self-discharge period may be measured.

In other words, the measurement unit 20 may measure at least one of the charging time, the cumulative current amount, and the amount of voltage drop and use the same for diagnosing low voltage failure.

Next, the control unit 30 is a component which compares the measured parameter with a reference parameter and determines the low voltage failure of the battery cell on the basis of a comparison result. Here, the reference parameter is a reference value set for the low voltage failure determination comparison, and may be set based on, for example, each parameter (that is, charging time, a cumulative current amount and an amount of voltage drop) measured from a battery cell having normal insulation resistance and a battery cell having weakened insulation resistance (or a battery cell having low voltage failure). Such a reference parameter may be set differently depending on the type of the battery cell.

As an example, the control unit 30 may determine whether the battery cell is a normal battery cell or a defective battery cell by determining whether a predetermined condition is satisfied by comparing the measured parameter with a reference parameter.

For example, when a parameter is charging time, if measured charging time is less than 10% of reference charging time, the battery cell may be determined to be a normal battery cell, and if 10% or greater, the battery cell may be determined to be a battery cell having low voltage failure. In other words, when the difference between the measured charging time and the reference charging time is less than a predetermined reference value, the battery cell may be determined to be a normal battery cell, and if the difference is greater than or equal to the predetermined reference value, the battery cell may be determined to be a battery cell having low voltage failure.

Alternatively, when a parameter is a cumulative current amount, for example, if a measured cumulative current amount is less than 140% of a reference cumulative current amount, the battery cell may be determined to be a normal battery cell, and if 140% or greater, the battery cell may be determined to be a battery cell having low voltage failure. In other words, if the difference between the measured cumulative current amount and the reference cumulative current amount is less than a predetermined reference value, the battery cell may be determined to be a normal battery cell, and if the difference is greater than or equal to the predetermined reference value, the battery cell may be determined to be a battery cell having low voltage failure.

Alternatively, when a parameter is an amount of voltage drop, for example, if the difference between a measured amount of voltage drop and a reference amount of voltage drop is less than 0.3, V, the battery cell may be determined to be a normal battery cell, and if the difference is greater than or equal to 0.3 V, the battery cell may be determined to be a battery cell having low voltage failure. In other words, if the difference between the measured amount of voltage drop and the reference amount of voltage drop is less than a predetermined reference value, the battery cell may be determined to be a normal battery cell, and if the difference is greater than or equal to the predetermined reference value, the battery cell may be determined to be a battery cell having low voltage failure.

As an example, as shown in FIG. 3, the apparatus for diagnosing low voltage of a secondary battery cell according to the present invention may further include a first storage unit 40 for storing measurement parameters and a second storage unit 50 for storing reference parameters. Of course, the first storage unit 40 and the second storage unit 50 may be configured to be one memory device.

In addition, the second storage unit 50 may store reference parameters for each type of the battery cell.

Meanwhile, the control unit 30 may function as a processor for controlling a manufacturing process of a secondary battery, that is, an activation process.

Figure 4:
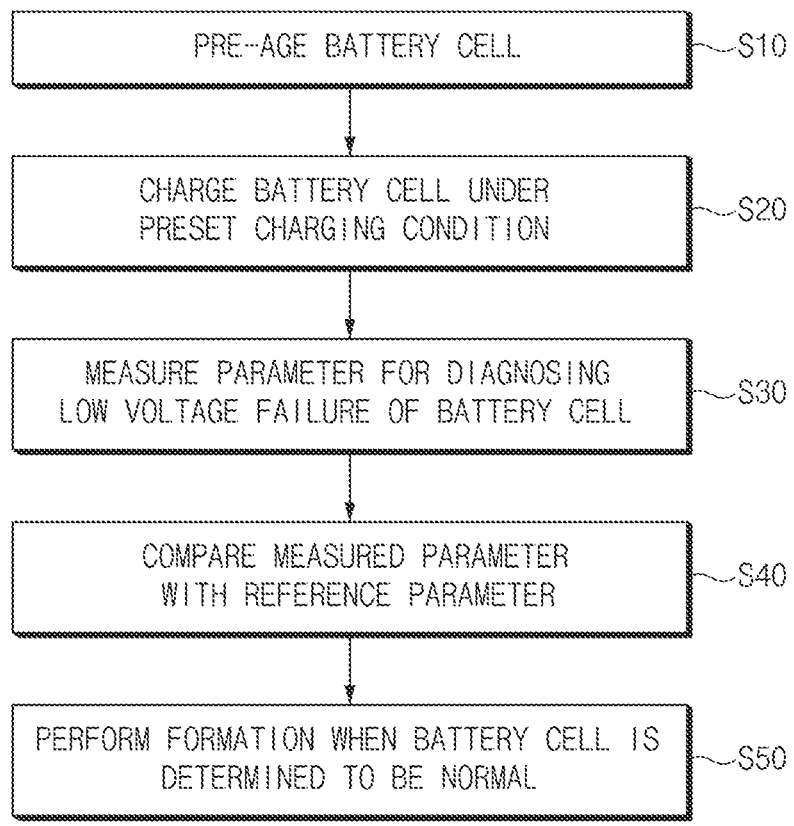
FIG. 4 is a schematic flow chart showing a method for diagnosing low voltage of a secondary battery cell according to an embodiment of the present invention.

Next, with reference to FIG. 4, a method for diagnosing low voltage of a secondary battery cell according to the present invention will be described. FIG. 4 is a flow chart showing the method for diagnosing low voltage of a secondary battery cell according to an embodiment of the present invention.

As shown in FIG. 4, the method for diagnosing low voltage of a secondary battery cell according to an embodiment of the present invention first includes pre-aging a battery cell S10. Specifically, an electrode assembly is received in a battery container and an electrolyte is injected thereto, and the mixture is subjected to an electrode wetting period of a predetermined period of time to manufacture a battery cell.

Next, a battery cell is charged according to a preset charging condition S20 after the pre-aging process. For example, the battery cell may be charged to a preset voltage with a constant current in a constant current mode, or may be charged to a preset voltage with a constant current in a constant current-constant voltage mode and then charged to a preset current with a constant voltage by the charging unit 10.

Here, the preset voltage (for example, a target voltage) is set to a voltage of which a voltage change rate with respect to an SOC is greater than or equal to a preset reference value. For example, the preset voltage is set to 2.5 V or less.

Next, a parameter for determining low voltage failure of the battery cell is measured S30. For example, the parameter for determining low voltage failure may be measured during a charging period or a self-discharge period of the battery cell by the measurement unit 20.

Here, the parameter may be a charging time from when the charging of the battery cell is started to when the battery cell reaches a preset voltage.

Alternatively, the parameter may be a cumulative current amount. For example, the parameter may be a cumulative current amount accumulated from when the charging is started to the battery cell reaches the preset voltage. Here, the cumulative current amount is a cumulative current amount in a constant current mode. Alternatively, the parameter may be a cumulative current amount accumulated from when the charging is started to the battery cell reaches a preset voltage and a preset current. Here, the cumulative current amount may be either a cumulative current amount in a constant current-constant voltage mode or a cumulative current amount in a constant current charging interval of the constant current-constant voltage mode.

Alternatively, the parameter may be an amount of voltage drop of the battery cell from when the battery cell has reached a preset voltage and self-discharge is then started to a preset time.

Alternatively, the parameter may be two or more of charging times, a cumulative current amount and an amount of voltage drop.

Next, the measured parameter is compared with a reference parameter S40. Here, the reference parameter is a reference value set for the low voltage failure determination comparison, and may be set based on, for example, each parameter range (that is, charging time, a cumulative current amount and an amount of voltage drop) measured from a battery cell having normal insulation resistance and a battery cell having weakened insulation resistance (or a battery cell having low voltage failure). The reference parameter may be set differently depending on the type of the battery cell.

In addition, in the comparison step S40, the measured parameter may be compared with the reference parameter to determine whether a predetermined condition is satisfied, thereby determining whether the battery cell is a normal battery cell or a defective battery cell. The comparison step S40 may be performed by the control unit 30.

Next, formation is performed S50 when the battery cell is determined to be normal. The formation performance process may be performed by, for example, the control unit 30 for controlling a manufacturing process of the secondary battery, that is, an activation process.

Figure 5:
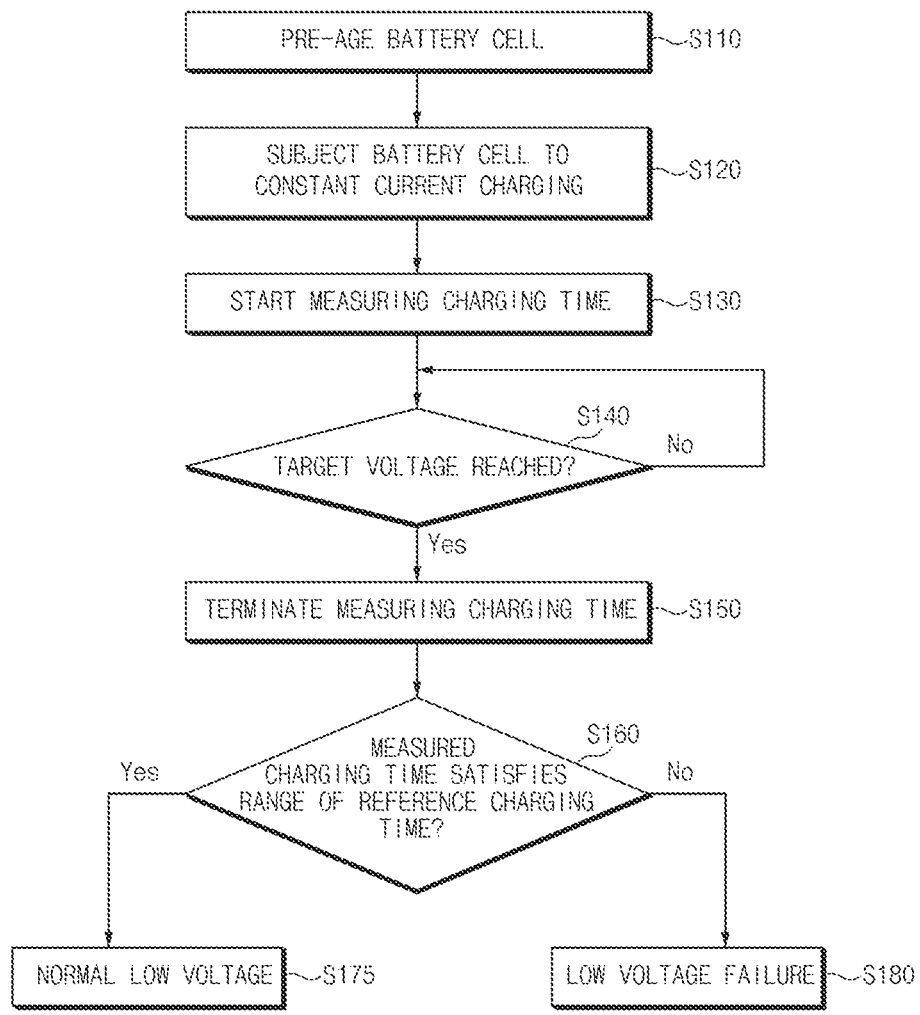
FIG. 5 is a flow chart showing a method for diagnosing low voltage of a secondary battery cell according to an embodiment of the present invention.

Next, with reference to FIG. 5 and FIG. 6, a method for diagnosing low voltage failure of a secondary battery cell based on charging time according to an embodiment of the present invention will be described. FIG. 5 is a flow chart showing a method for diagnosing low voltage of a secondary battery cell according to an embodiment of the present invention, and FIG. 6 is a graph comparing the charging time of good and defective secondary battery cell products measured by the method according to FIG. 5.

As shown in FIG. 5, the method for diagnosing low voltage of a secondary battery cell based on a charging time according to an embodiment of the present invention first includes pre-aging a battery cell S110. Next, the battery cell is subjected to constant current charging S120. Here, the constant current charging may be charging in a constant current mode or charging in a constant current mode of a constant current-constant voltage mode. At this time, the charging time starts to be measured from the start of the charging S130. Next, whether or not a charging voltage has reached a target voltage (a preset voltage, for example, 1.5 V) is determined S140. If the charging voltage has not reached the target voltage (No), the determination of Step S140 is repeated. If the charging voltage has reached the target voltage (Yes), the measurement of the charging time until the target voltage is reached is terminated S150. Next, whether or not the measured charging time satisfies a range of a preset reference charging time is determined S160. For example, if the measured charging time is less than 10% of the reference charging time, the battery cell is determined to be a battery cell having normal low voltage S175, and if greater than or equal to 10% of the reference charging time, the battery cell is determined to be a battery cell having low voltage failure S180. Here, the range of the reference charging time is, for example, a value which is set in advance based on charging time data obtained from battery cells having insulation resistance satisfying a normal condition. In addition, the range of the reference charging time may be set based on each charging time ranges measured from battery cells having normal insulation resistance and battery cells having low voltage failure, further taking into account charging time data obtained from the battery cells having low voltage failure. The range of the reference charging time may be set differently depending on the type of the battery cell.

Figure 6:
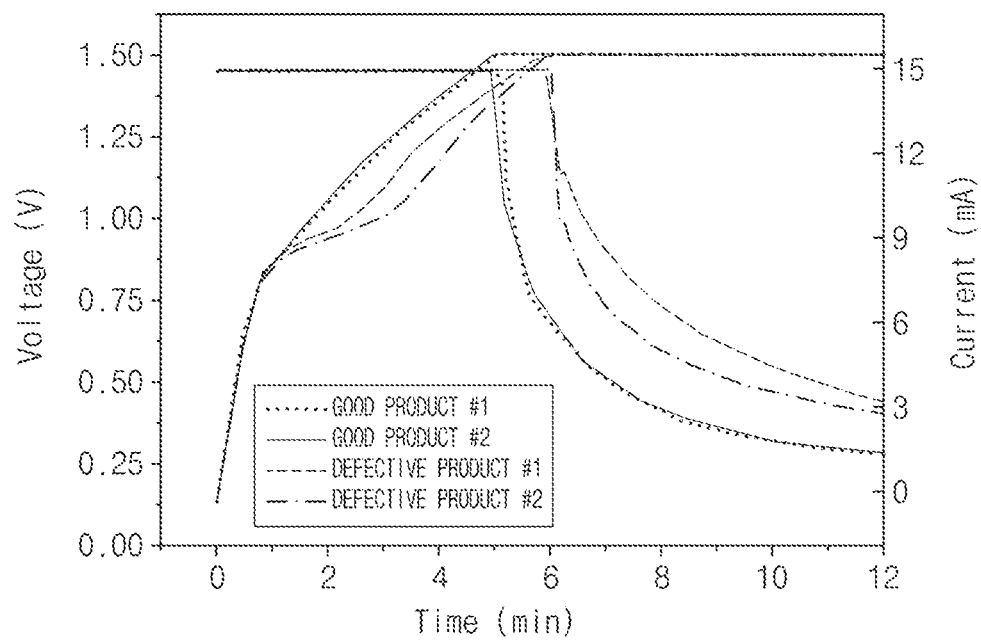
FIG. 6 is a graph comparing the charging time of good products and defective products of a secondary battery cell measured by the method according to FIG. 5.

When comparing the charging time between good products and defective products of a secondary battery cell measured by the method according to FIG. 5, as shown in FIG. 6, it can be seen that battery cells of good products #1 and #2 reach a voltage of 1.5 V earlier than battery cells of defective products #1 and #2 in a constant current section, and charging time until reaching the voltage of 1.5 V was 10% or greater for the battery cells of defective products than for the battery cells of good products. For reference, FIG. 6 is a result obtained by applying a micro-current at 1/200 C in a constant current mode and cutting off at 5 uA in a constant voltage mode when charging in a constant current-constant voltage mode. The good products of a secondary battery cell uses a jelly roll having normal insulation resistance, and the defective products of a secondary battery cell uses a jelly roll having a Hi-Pot test defect.

According to the method for diagnosing low voltage of a secondary battery cell according to the present invention, by using the charging time in the pre-aging step of the activation process of a secondary battery, it is possible to quickly and accurately determine the low voltage failure of a secondary battery earlier than a low voltage test in a typical OCV tracking process.

Figure 7:
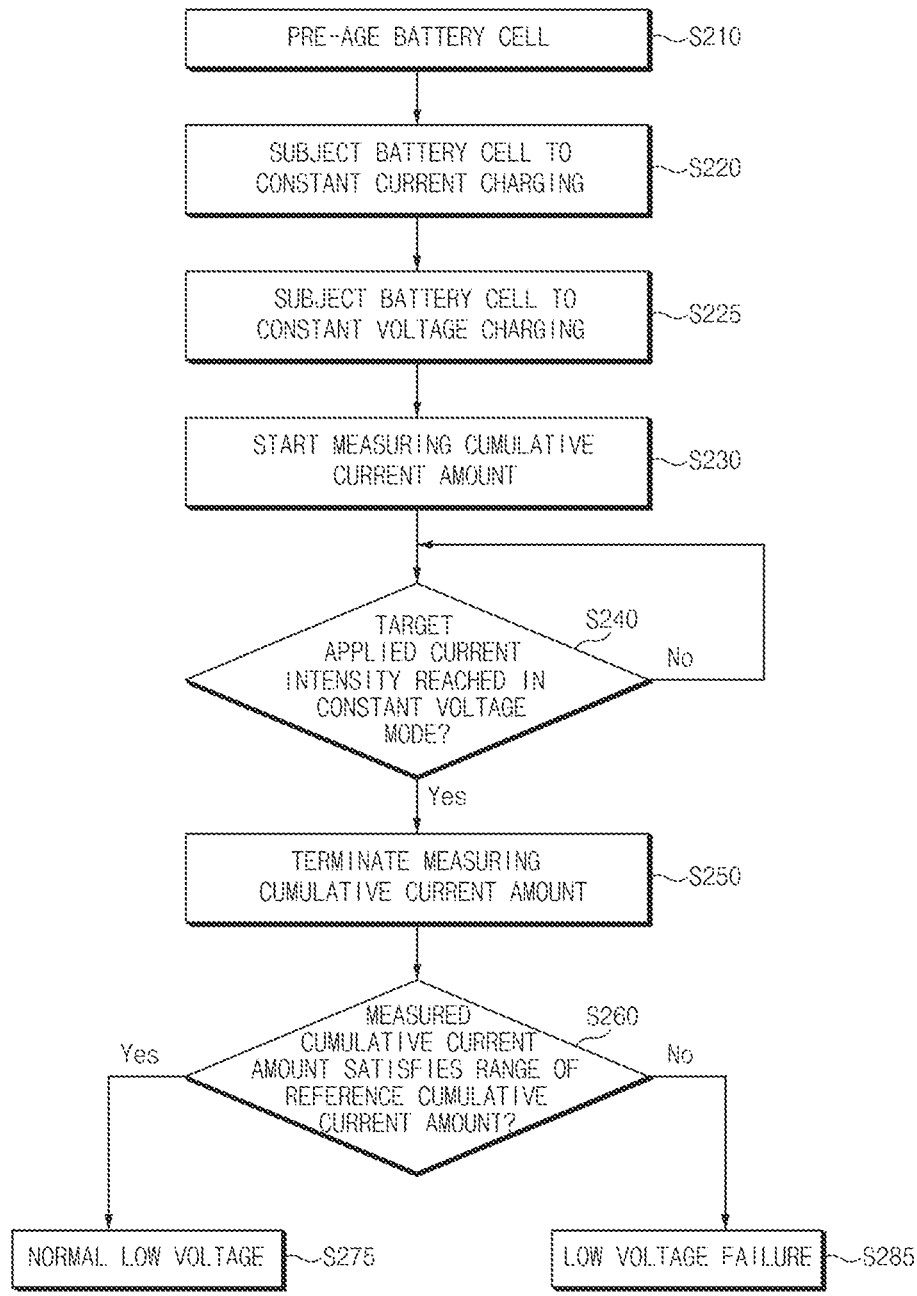
FIG. 7 is a flow chart showing a method for diagnosing low voltage of a secondary battery cell according to another embodiment of the present invention.

Next, with reference to FIG. 7 and FIG. 8, a method for diagnosing low voltage failure of a secondary battery cell based on a cumulative current amount according to another embodiment of the present invention will be described. FIG. 7 is a flow chart showing a method for diagnosing low voltage of a secondary battery cell according to another embodiment of the present invention, and FIG. 8 is a graph comparing the charging time between good products and defective products of a secondary battery cell measured by the method according to FIG. 7.

As shown in FIG. 7, the method for diagnosing low voltage of a secondary battery cell based on a cumulative current amount according to an embodiment of the present invention first includes pre-aging a battery cell S210. Next, the battery cell is subjected to constant current charging S220. At this time, a cumulative current amount of the battery cell starts to be measured from the start of the constant current charging S225. Next, when the battery cell reaches a target voltage, the battery cell is subjected to constant voltage charging S230. For reference, in the case of a constant current-constant voltage mode, after the target voltage is reached in a constant current mode, the intensity of an applied current is decreased (for example, changed) in a constant voltage mode. Next, whether or not a charging current of the battery cell in the constant voltage mode has reached a preset target applied current is determined S240. If the charging current has not reached the target applied current (No), the determination of Step S240 is repeated. If the charging current has reached the target applied current (Yes), the measurement of the cumulative current amount until the target applied current is reached is terminated S250. Next, whether or not the measured cumulative current amount satisfies a range of a preset cumulative current amount is determined S260. For example, if the measured cumulative current amount is less than 140% of the reference cumulative current amount, the battery cell is determined to be a battery cell having normal low voltage S275, and if greater than or equal to 10% of the reference charging time, the battery cell is determined to be a battery cell having low voltage failure S285. Here, the range of the reference cumulative current amount is, for example, a value which is set in advance based on cumulative current amount data obtained from battery cells having insulation resistance satisfying a normal condition. In addition, the range of the reference cumulative current amount may be set based on each cumulative current amount ranges measured from battery cells having normal insulation resistance and battery cells having low voltage failure, further taking into account charging time data obtained from the battery cells having low voltage failure. The range of the reference cumulative current amount may be set differently depending on the type of the battery cell.

However, the cumulative current amount in FIG. 7 exemplifies a combined cumulative current amount of a cumulative current amount in a constant current mode and a cumulative current amount in a constant voltage mode, but the cumulative current amount may be a cumulative current amount in the constant voltage mode. In this case, Step S225 in which a cumulative current amount of the battery cell starts to be measured is located between Step S230 and Step S240, so that the cumulative current amount of the battery cell from the start of a constant voltage charging starts to be measured after the target voltage is reached. In addition, as described above, the cumulative current amount may be a cumulative current amount during a constant current charging period when charged only in a constant current mode.

Figure 8:
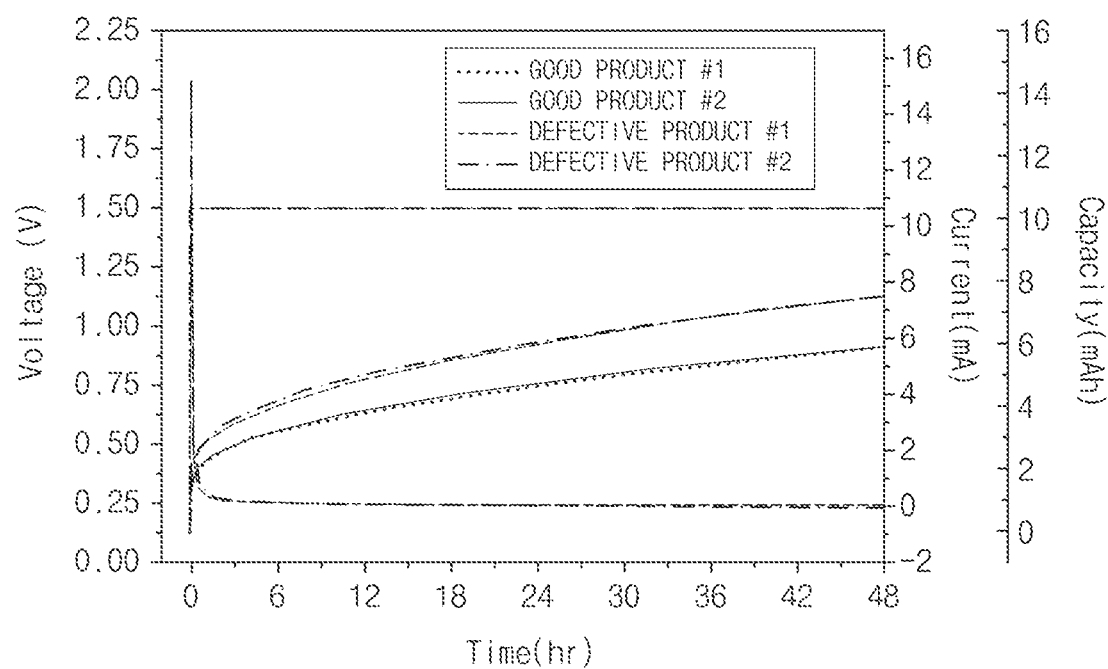
FIG. 8 is a graph comparing the cumulative current of good products and defective products of a secondary battery cell measured by the method according to FIG. 7.

When comparing the cumulative current amount between good products and defective products of a secondary battery cell measured by the method according to FIG. 7, as shown in FIG. 8, when a current in a constant current mode section and a current in a constant voltage mode section were accumulated, it was confirmed that the battery cells of defective products consumed about 40% more current than the battery cells of good products thereof based on 24 hours. For reference, FIG. 8 is a result obtained by applying a micro-current at 1/200 C in a constant current mode and cutting off at 5 uA in a constant voltage mode when charging in a constant current-constant voltage mode. The good products of a secondary battery cell uses a jelly roll having normal insulation resistance, and the defective products of a secondary battery cell uses a jelly roll having a Hi-Pot test defect.

According to the method for diagnosing low voltage of a secondary battery cell according to the present invention, by using the cumulative current amount in the pre-aging step of the activation process of a secondary battery, it is possible to quickly and accurately determine the low voltage failure of a secondary battery earlier than a low voltage test in a typical OCV tracking process.

Figure 9:
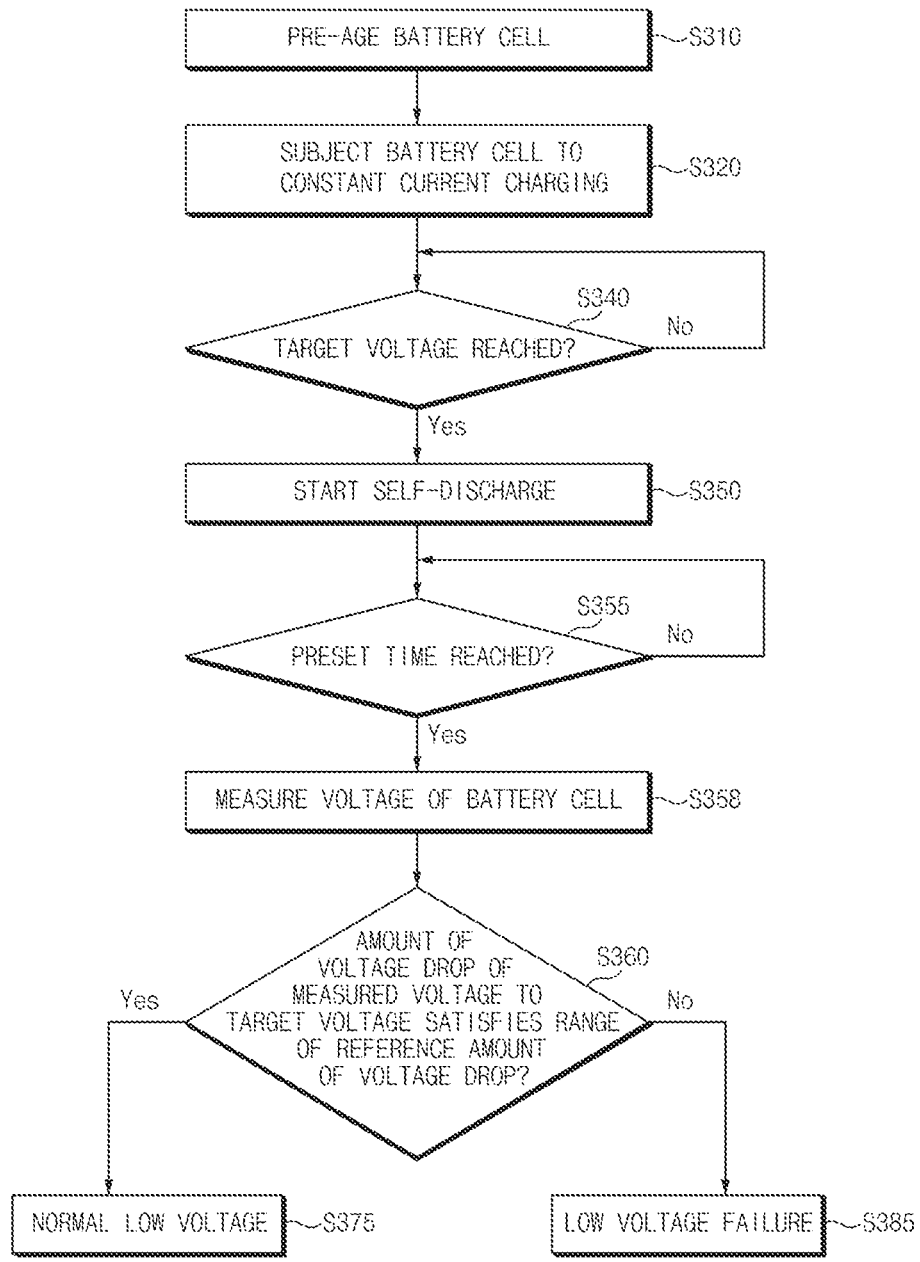
FIG. 9 is a flow chart showing a method for diagnosing low voltage of a secondary battery cell according to another embodiment of the present invention.
Figure 10:
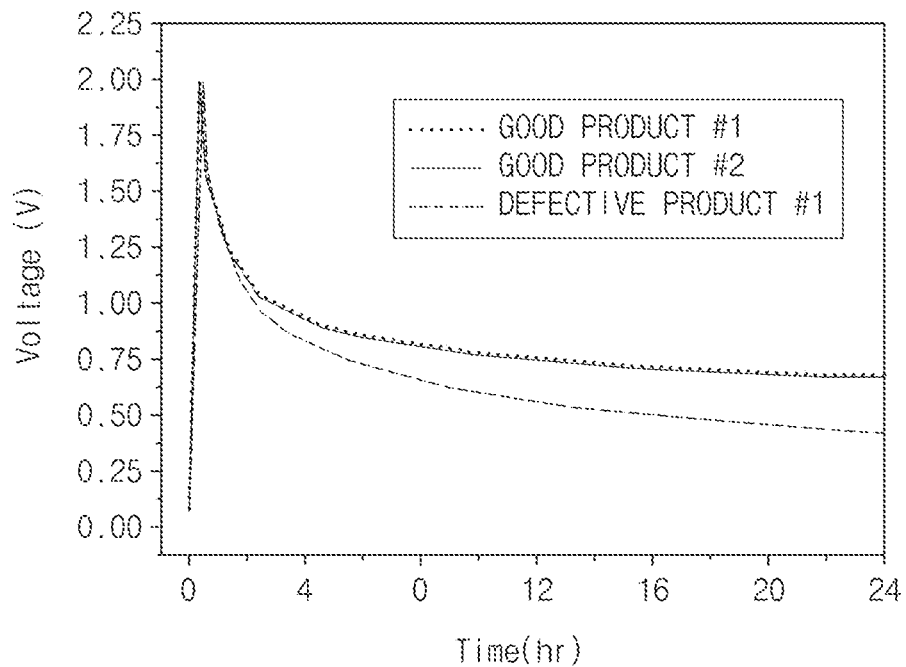
FIG. 10 is a graph comparing the amount of voltage drop measured by the method according to FIG. 9 after charging good products and defective products of a secondary battery cell.

Next, with reference to FIG. 9 and FIG. 10, a method for diagnosing low voltage failure of a secondary battery cell based on an amount of voltage drop according to yet another embodiment of the present invention will be described. FIG. 9 is a flow chart showing a method for diagnosing low voltage of a secondary battery cell according to yet another embodiment of the present invention. FIG. 10 is a graph comparing the amount of voltage drop measured by the method according to FIG. 9 after charging good products and defective products of a secondary battery cell.

As shown in FIG. 9, the method for diagnosing low voltage of a secondary battery cell based on an amount of voltage drop according to an embodiment of the present invention first includes pre-aging a battery cell S310. Next, the battery cell is subjected to constant current charging S320. At this time, the charging is performed by applying a micro-current at 1/200 C in a constant current mode. Next, whether or not a charging voltage has reached a target voltage (for example, 2.0 V) is determined S340. If the charging voltage has not reached the target voltage (No), the determination of Step S340 is repeated. If the charging voltage has reached the target voltage (Yes), the self-discharge of the battery cell starts S350. Next, whether or not a self-discharge period of time has reached a preset period of time (for example, 24 hr) is determined S355. If the self-discharge period of time has not reached the preset period of time (No), the self-discharge is repeated. If the self-discharge period of time has reached the preset period of time (Yes), the voltage of the battery cell is measured S358. Next, whether or not an amount of voltage drop for a target voltage of the measured voltage satisfies a reference amount of voltage drop is determined S360. For example, if the difference between the measured amount of voltage drop and the reference amount of voltage drop is less than 0.3 V, the battery cell is determined to be a battery cell having normal low voltage S375, and if the difference is 0.3 V or greater, the battery cell is determined to be a battery cell having low voltage failure. Here, the range of the reference amount of voltage drop is, for example, a value which is set in advance based on amount of voltage drop data obtained from battery cells having insulation resistance satisfying a normal condition. In addition, the range of the reference amount of voltage drop may be set based on each amount of voltage drop range measured from battery cells having normal insulation resistance and battery cells having low voltage failure, further taking into account amount of voltage drop data obtained from the battery cells having low voltage failure. The range of the reference amount of voltage drop may be set differently depending on the type of the battery cell.

When comparing the amount of voltage drop between good products and defective products of a secondary battery cell measured by the method according to FIG. 9, as shown in FIG. 10, it can be seen that the amount of voltage variation between battery cells of defective products and battery cells of good products after being charged to 2.0 V followed by self-discharging for 24 hours exhibited a difference of approximately 0.3 V or greater. For reference, in FIG. 10, the good products of a secondary battery cell uses a jelly roll having normal insulation resistance, and the defective products of a secondary battery cell uses a jelly roll having a Hi-Pot test defect. According to the above results, in the case in which self-discharge is performed for 13 days after shipment charge based on a typical low voltage diagnostic method, low voltage failure may be screened in 0.00xV, that is, a voltage fluctuation unit with a third decimal point. However, during a low voltage diagnosis according to the present invention, low voltage failure may be screened within 24 hours in 0.xV, that is, a voltage variation unit with a first decimal point, so that the accuracy of determination may be improved.

According to the present invention, low voltage failure of a battery cell may be diagnosed early by using properties of a region in which a voltage change rate to an SOC of the battery cell is large during a pre-aging process step of an activation process.

In addition, according to the present invention, it is possible to determine low voltage within approximately 24 hours when compared to a typical low voltage determination period of 7-14 days, so that diagnosis time may be minimized. Furthermore, since early diagnosis is possible, a subsequent process for a battery cell having low voltage failure may be omitted and corresponding diagnosis time may be shortened, and, thus, diagnosis costs may be reduced to a minimum. In addition, by using properties of a region in which a voltage change rate to an SOC of the battery cell is large during a pre-aging process step, diagnosis accuracy may be increased.

Although the present invention has been described with reference to the preferred embodiments and the drawings, it is to be understood that the invention is not limited thereto, and it is to be understood by those skilled in the art that various changes in form and details may be made therein without departing from the spirit and scope of the invention as defined by the following claims.

LIST OF THE REFERENCE NUMBERS

10: charging unit
20: measurement unit
30: control unit
40: first storage unit
50: second storage unit

The invention claimed is:

1. A method for diagnosing low voltage failure of a secondary battery cell, the method comprising:
pre-aging a battery cell;
charging the battery cell to have a preset voltage according to a preset charging condition, wherein the preset voltage is set to a voltage of which a voltage change rate with respect to a state of charge (SOC) is greater than or equal to a preset reference value;
measuring a parameter for determining the low voltage failure of the battery cell;
comparing the measured parameter with a reference parameter to determine whether the battery cell is normal; and
subjecting the pre-aged battery cell to a subsequent charging under a predetermined voltage condition when the battery cell is determined to be normal, wherein the subsequent charging is an initial charging of a formation process.

2. The method of claim 1, wherein the parameter is a charging duration from when the charging is started to when the battery cell reaches the preset voltage.

3. The method of claim 2, wherein the charging duration is either a charging duration in a constant current mode, or a charging duration in a constant current charging interval of a constant current-constant voltage mode.

4. The method of claim 1, wherein the parameter is a cumulative current amount accumulated from when the charging is started to when the battery cell reaches the preset voltage.

5. The method of claim 4, wherein the cumulative current amount is measured in a constant current mode.

6. The method of claim 1, wherein the parameter is a cumulative current amount accumulated from when the charging is started to when the battery cell reaches the preset voltage and a preset current.

7. The method of claim 6, wherein the cumulative current amount is measured either in a constant current-constant voltage mode or in a constant current charging interval of the constant current-constant voltage mode.

8. The method of claim 1, wherein the parameter is an amount of voltage drop of the battery cell from when the battery cell has reached the preset voltage and self-discharge is then started to a preset time.

9. The method of claim 1, wherein the reference parameter is set differently depending on a type of the battery cell.

10. An apparatus for diagnosing low voltage failure of a secondary battery cell, the apparatus comprising:
a charging unit configured to charge a battery cell to have a preset voltage according to a preset charging condition, after a pre-aging process and before subjecting the pre-aged battery cell to a subsequent charging under a predetermined voltage condition, wherein the preset voltage is set to a voltage of which a voltage change rate with respect to a state of charge (SOC) is greater than or equal to a preset reference value, and wherein the subsequent charging is an initial charging of a formation process;
a measurement unit configured to measure a parameter for determining the low voltage failure of the battery cell; and
a control unit configured to compare the measured parameter with a reference parameter and determine the low voltage failure of the battery cell on the basis of a comparison result.

11. The apparatus of claim 10, wherein the measurement unit measures, as the parameter, a charging duration from when the charging is started to when the battery cell reaches the preset voltage.

12. The apparatus of claim 11, wherein the charging duration is measured either in a constant current mode or in a constant current charging interval of a constant current-constant voltage mode.

13. The apparatus of claim 10, wherein the measurement unit measures, as the parameter, a cumulative current amount accumulated from when the charging is started to when the battery cell reaches the preset voltage.

14. The apparatus of claim 13, wherein the cumulative current amount is measured in a constant current mode.

15. The apparatus of claim 10, wherein the measurement unit measures, as the parameter, a cumulative current amount accumulated from when the charging is started to when the battery cell reaches the preset voltage and a preset current.

16. The apparatus of claim 15, wherein the cumulative current amount is measured either in a constant current-constant voltage mode or in a constant current charging interval of the constant current-constant voltage mode.

17. The apparatus of claim 10, wherein the measurement unit measures, as the parameter, an amount of voltage drop of the battery cell from when the battery cell has reached the preset voltage and self-discharge is then started to a preset time.

18. The apparatus of claim 10, wherein the reference parameter is set differently depending on a type of the battery cell.

* * * * *